United States Patent
Hart et al.

(10) Patent No.: US 8,981,491 B1
(45) Date of Patent: Mar. 17, 2015

(54) MEMORY ARRAY HAVING IMPROVED RADIATION IMMUNITY

(75) Inventors: Michael J. Hart, Palo Alto, CA (US); James Karp, Saratoga, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 13/439,706

(22) Filed: Apr. 4, 2012

(51) Int. Cl.
*H01L 27/085* (2006.01)

(52) U.S. Cl.
USPC ............... 257/372; 257/373; 257/E21.645

(58) Field of Classification Search
USPC .................... 257/372, 373, E21.645
See application file for complete search history.

(56) References Cited

U.S. PATENT DOCUMENTS

| | | | | |
|---|---|---|---|---|
| 5,506,437 | A * | 4/1996 | May et al. | 257/373 |
| 6,005,797 | A * | 12/1999 | Porter et al. | 365/156 |
| 6,573,773 | B2 * | 6/2003 | Maki et al. | 327/200 |
| 6,583,470 | B1 * | 6/2003 | Maki et al. | 257/349 |
| 6,664,608 | B1 * | 12/2003 | Burr | 257/549 |

OTHER PUBLICATIONS

Hsieh, C.M., et al., *A field funneling effect on the collection of alpha-particle-generated carriers in silicon devices*, IEEE Electron Device Letters, vol. 2, EDL. 2, No. 4, pp. 103-105, Apr. 1981.
Ziegler, J.F. et al., *SER-History, Trends and Challengers, a guide for designing with Memory ICs*, Cypress Semiconductor, pp. 6-3-6-5, Chapter 6, 2004, US.

* cited by examiner

*Primary Examiner* — Julia Slutsker
(74) *Attorney, Agent, or Firm* — John J. King

(57) ABSTRACT

A memory array having improved radiation immunity is described. The memory array comprises a plurality of memory elements, each memory element having an p-type transistor formed in an n-type region; and a plurality of p-wells, each p-well having an n-type transistor coupled to a corresponding p-type transistor to form a memory element of the plurality of memory elements; wherein each p-well provides a p-n junction to dissipate minority charge in a portion of the n-type region occupied by a corresponding p-type transistor and associated with at least two adjacent memory elements. A method of implementing a memory array is also described.

19 Claims, 7 Drawing Sheets

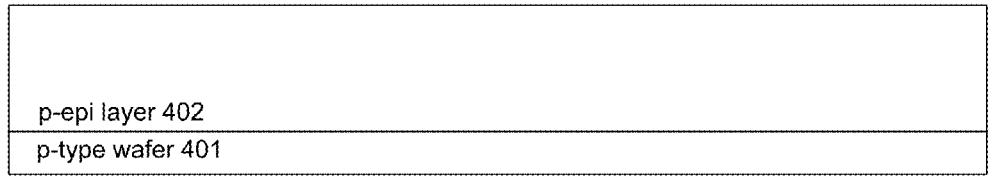
FIG. 6-A
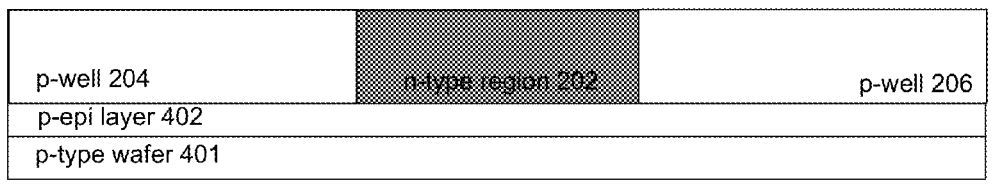
FIG. 6-B
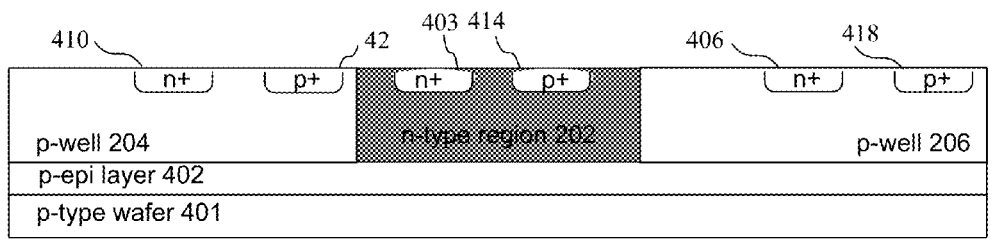
FIG. 6-C
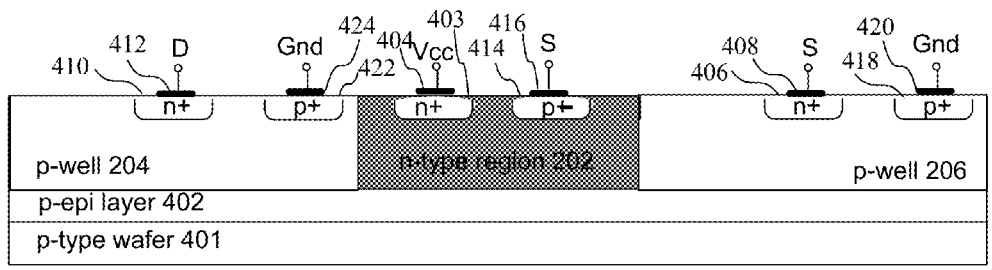
FIG. 6-D

MEMORY ARRAY HAVING IMPROVED RADIATION IMMUNITY

FIELD OF THE INVENTION

An embodiment relates generally to integrated circuits, and in particular, to a memory array having improved radiation immunity and to a method of implementing a memory array.

BACKGROUND OF THE INVENTION

Memory cells are implemented in devices such as integrated circuit devices to store data. The data may be used during operation of the device or, in the case of programmable integrated circuits, to configure the integrated circuit to perform functions desired by the user of the device. However, for a variety of reasons, data may become corrupted. The corrupted data may impact the performance of the integrated circuit. In some instances, the corrupted data may render the integrated circuit unusable until the correct data is restored in the memory. While techniques exist to both detect and correct data errors without having to reload the entire memory, such techniques have significant limitations.

One way that data in a memory element may be corrupted is through a radiation impact, often called a single event upset (SEU) strike. Such as a strike may change or "upset" data stored in a memory element. Conventional techniques to sink minority carries generated during an SEU strike rely on a "buried layer" having a high recombination rate. However, experiments have shown that this layer leads to opposite result. That is, the SEU rate increases as highly doped buried P+ layer repels minority carriers or charge, such as electrons in p-substrate or holes in an n-type region. Accordingly, conventional methods of addressing the impact of an SEU strike have failed to prevent the undesirable loss of data.

SUMMARY OF THE INVENTION

A memory array having improved radiation immunity is described. The memory array comprises a plurality of memory elements, each memory element having an p-type transistor formed in an n-type region; and a plurality of p-wells, each p-well having an n-type transistor coupled to a corresponding p-type transistor to form a memory element of the plurality of memory elements; wherein each p-well provides a p-n junction to dissipate minority charge in a portion of the n-type region occupied by a corresponding p-type transistor and associated with at least two adjacent memory elements.

According to other embodiments, for each memory element, p-type transistors may be formed between a pair of p-wells, each p-well of the pair of p-wells forming a p-n junction for dissipating minority charge in the n-type region between the pair of p-wells. Further, each p-well may provide four p-n junctions to dissipate minority charge in portions of the n-type region surrounding the p-well. The each p-well is surrounded by the n-type region. Minority charge in the n-type region may be attracted to at least two p-wells of the plurality of p-wells. The n-type region may be formed in the p-type epitaxial layer, wherein the p-type epitaxial layer may be formed on a p-type substrate.

According to an alternate embodiment, a memory array having improved radiation immunity comprises a p-type epitaxial layer; an n-type region formed in the p-type epitaxial layer; and a plurality of p-wells formed in the p-type epitaxial layer, each p-well having an n-type transistor coupled to a corresponding p-type transistor in the n-type region; wherein each memory element of the memory array comprises a first p-well and a second p-well of the plurality of p-wells.

Each p-well may further comprise a p-type region which may be coupled to ground to attract undesirable majority charge in the p-well. The n-type region may comprise a plurality of n-wells coupled to a reference voltage to attract undesirable majority charge in the n-type region. Each n-well of the plurality of n-wells may be associated with a corresponding memory element of the plurality of memory elements. Each p-well of a memory element may provide p-n junctions to dissipate minority charge in a region occupied by a corresponding p-type transistor. Further, each p-well of the memory element may provide a p-n junction to dissipate minority charge in regions associated with at least two adjacent memory elements. Minority charge in the n-type region may be attracted to at least two p-wells of the plurality of p-wells.

A method of implementing a memory array having improved radiation immunity is also described. The method comprises forming a plurality of p-wells, each p-well having an n-type transistor coupled to a corresponding p-type transistor in an n-type region; and forming a plurality of memory elements of the memory array, each memory element comprising a first p-well and a second p-well; wherein each p-well provides a p-n junction to dissipate minority charge in the n-type region.

Forming a plurality of p-wells may comprise providing, for each p-well, p-n junctions to dissipate minority charge in a region occupied by a p-type transistor of a corresponding memory element. Forming a plurality of p-wells may comprise forming the plurality of p-wells in a p-type epitaxial layer. The method may further comprise forming the n-type region in a p-type epitaxial layer, and forming the p-type epitaxial layer on a p-type substrate. For each memory element, the first p-well may be formed in a p-well which is common to a first adjacent memory element and the second p-well may be formed in a p-well which is common to a second adjacent memory element.

BRIEF DESCRIPTION OF THE DRAWINGS

FIG. 6 is a series of cross-sectional views showing the formation of the CMOS memory array of FIG. 1 according to an embodiment;

DETAILED DESCRIPTION OF THE DRAWINGS

According to various embodiments set forth below, a CMOS memory array provides an efficient and low cost solution to improve the SEU immunity of CMOS SRAM cells. The nmos part of each memory cell in its own p-well completely or partially surrounded by a portion of an n-type region. Accordingly, the perimeter of the n-type region for each memory cell may be doubled, therefore significantly enhancing the removal of minority charge which is generated during an SEU strike. That is, the arrangement increases the perimeter of the n-type region, and therefore increases the area of p-n junctions of the n-type region and the p-well for each SRAM cell. Enhancing the removal of minority carriers leads to better SEU performance of the CMOS SRAM.

Figure 1:
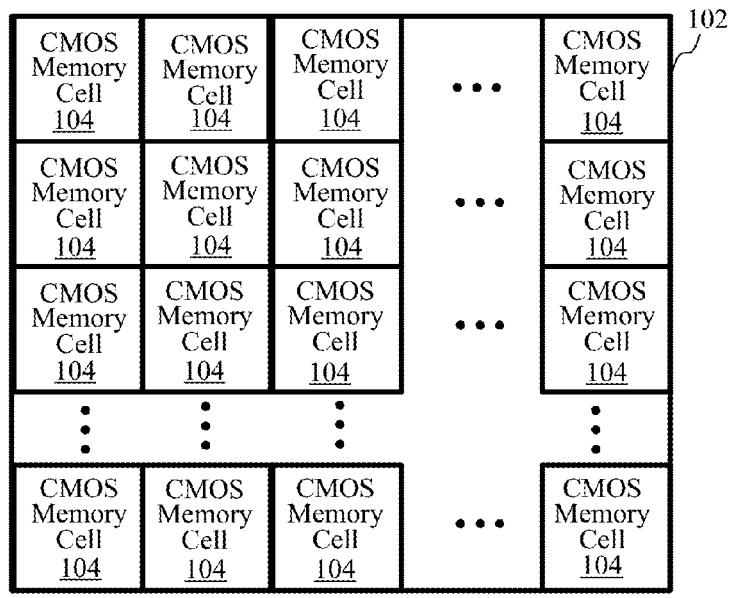
FIG. 1 is a top plan view of a memory array according to an embodiment.
Figure 2:
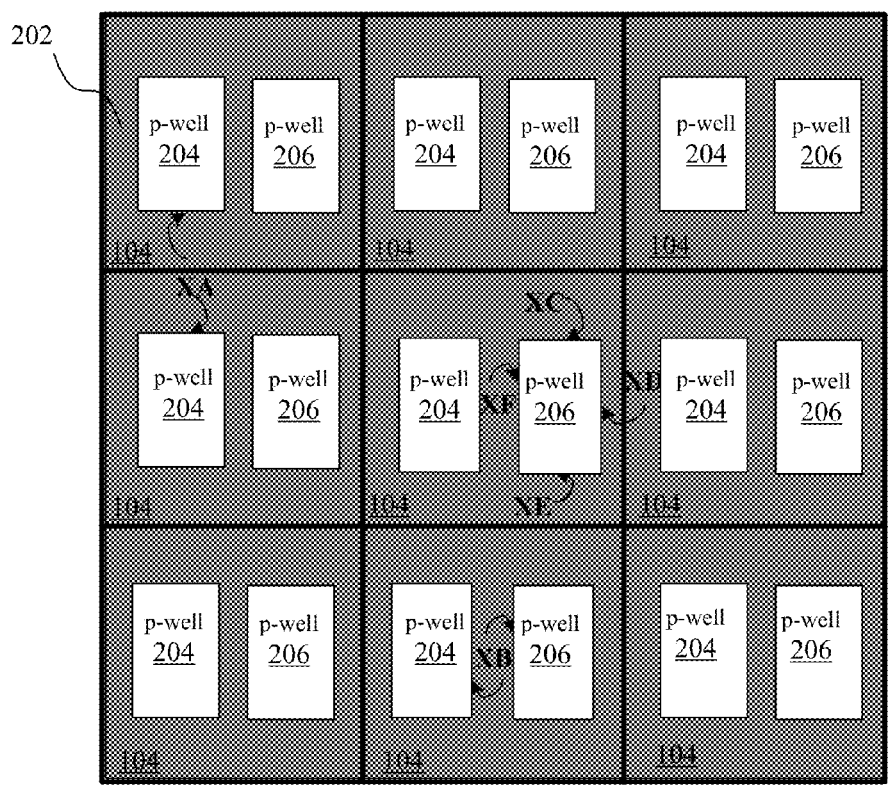
FIG. 2 is a top plan view of an enlarged portion of a section of FIG. 1 showing additional details of the CMOS memory cells according to an embodiment.
Figure 3:
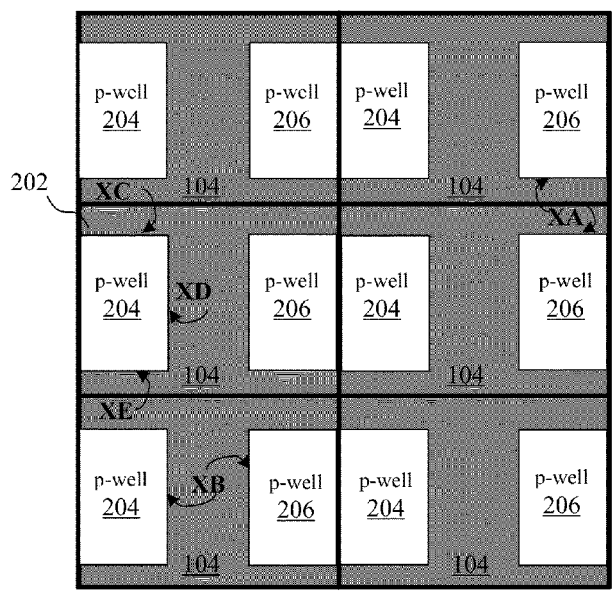
FIG. 3 is a top plan view of an enlarged portion of a section of FIG. 1 showing additional details of the CMOS memory cells according to an alternate embodiment.

Turning first to FIG. 1, a top plan view of a memory array according to an embodiment is shown. In particular, a memory array such as a CMOS memory array 102 comprises a plurality of CMOS memory cells 104. As will be described in more detail below in reference to FIG. 9, the CMOS memory array 102 could be a part of a block of random access memory (BRAM), or other memory cells of the integrated circuit of FIG. 9. Additional details of the CMOS memory cells are shown in the embodiment of FIGS. 2 and 3, where each CMOS memory cell comprises two p-wells 204 and 206 which are partially or completely surrounded by an n-type region 202. Each p-well provides a p-n junction to dissipate minority charge in a portion of the n-type region occupied by a corresponding p-type transistor and associated with at least two adjacent CMOS memory elements. As will be described in more detail below in reference to the cross-sectional views of FIGS. 4 and 5, the arrangement of p-wells and the n-type region increases the p-n junction area which can attract minority charge in the n-type region 202.

The increased benefits of the enhanced p-n junction areas can be described by way of exemplary SEU strikes in various locations of the n-type region 202. While the locations of the SEU strikes are provided by way of example, and could be at any location of the n-type region 202, the SEU strikes shown in FIG. 2 help describe the various reverse biased p-n junctions which may attract minority charge in the n-type region 202. As will be described in more detail in reference to FIGS. 4 and 5, minority charge in the p-wells caused by SEU strikes will also be dissipated.

One benefit of the arrangement of the p-wells of the CMOS memory array of FIG. 2 is that minority charge in a region between two p-wells may be attracted to each p-well. For example, an SEU strike XA may be attracted to p-n junctions of two different p-wells 204 of two CMOS memory cells 104. Similarly, minority charge of an SEU strike XB between a p-well 204 and a p-well 206 of the same memory cell 104 may be attracted to either of the p-n junctions. The p-n junction area associated with a given p-well may be further described in reference to SEU strikes XC, XD, XE and XF. That is, four side walls of a single p-well may attract minority charge associated with SEU strikes XC, XD, XE and XF. Particular examples of the attraction of minority charge in the n-well to a p-n junction will be described in more detail in reference to FIGS. 4 and 5.

As shown in the embodiment of FIG. 3, the p-wells 204 and 206 are placed on the ends of the memory cell 104, where p-wells 204 and 206 of adjacent CMOS memory cells are formed in a common p-well. That is, the nmos transistors for each p-well 206 are formed in a common p-well with nmos transistors formed in a p-well 204 of an adjacent CMOS memory cell 104. Further, the nmos transistors for each p-well 204 are formed in a common p-well with nmos transistors formed in a p-well 206 of a different adjacent CMOS memory cell 104. While the arrangement of FIG. 3 provides the same benefit for the SEU strikes XA and XB, the portion of a p-well associated with a given CMOS memory cell 104 provides p-n junctions on only three walls, compared to the embodiment of FIG. 2. That is, the portion of a p-well associated p-well 204 would only provide a p-n junction to attract minority charge associated with SEU strikes XC, XD, and XE, but not XF as shown in FIG. 2. While the embodiment of FIG. 3 provides a reduced area requirement for the CMOS memory cells, the embodiment also provides a reduced SEU immunity. That is, embodiment of FIG. 3 provides a tradeoff of reduced area of the CMOS memory cells for reduced SEU immunity of the CMOS memory array.

Figure 4:
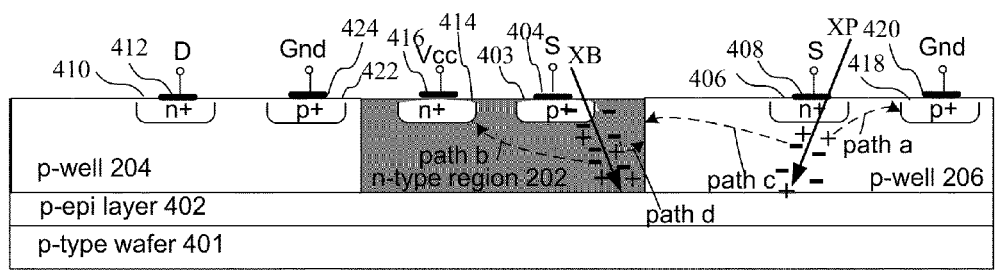
FIG. 4 is a cross-sectional view showing elements of the CMOS memory array of FIG. 1 which improve radiation immunity according to an embodiment.
Figure 5:
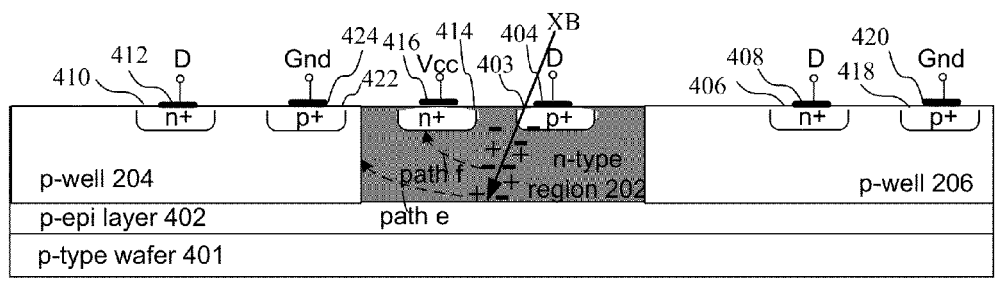
FIG. 5 is a cross-sectional view showing other elements of the CMOS memory array of FIG. 1 which improve radiation immunity according to an embodiment.

Before specifically describing the cross-sectional view of FIG. 4, it should be noted that a region is designated as a p-type region, or a p-well, or with a "p+" for having a higher positive carrier (i.e. hole) concentration than a region in which it is formed, while other regions are designated as an n-type, or an n-well, or with an "n+" for having a higher negative carrier (i.e. electron) concentration than the region in which it is formed. Further, the source and drain regions could be associated with a CMOS memory element of the embodiments of FIGS. 7 and 8 implemented in a CMOS memory array. As shown in FIG. 4, memory elements, such as memory elements of CMOS memory arrays, are formed using a p-type wafer 401 (i.e. a wafer having a greater concentration of positive carriers), and a p-type epitaxial (p-epi) layer 402 grown on p-type wafer 401. The n-type region 202 is also formed, such as by a diffusion or ion implantation process, in the p-epi layer 402. While the cross-sectional view of FIG. 4 shows a p-well 204, a portion of the n-type region 202 and a p-well 206, it should be understood that the cross-sectional views of FIGS. 4 and 5 could be taken at any location of the embodiments of FIGS. 2 and 3 showing those regions. Further, the source and drain elements of FIGS. 4 and 5 are shown by way of example to indicate that the cross section is taken in a region which would have the pmos transistors formed in the n-type region. For example, the cross-sectional views could be taken across the p-wells 204 and 206 of a given CMOS memory cell, where the pmos transistors for the CMOS memory cell are formed in the n-type region 202 between the p-wells 204 and 206 as shown in FIGS. 2 and 3.

According to the exemplary embodiment of FIG. 4, an n-well 403 and a corresponding source contact 404 of a pmos transistor are provided in the n-type region 202. An n-well 406 and a corresponding source contact 408 of a first nmos transistor are shown in the p-well 206, while a drain region 410 and a drain contact 412 of a second nmos transistor are shown in the p-well 204. Various taps are also provided in n-type region 202 and the p-wells 204 and 206 to attract excess majority charge. Taps in the p-wells 204 and 206 are coupled to a low voltage such as ground to attract undesirable positive charge in the p-wells, such as positive charge created by an SEU strike. Taps in the n-type region 202 are coupled to a positive voltage to attract undesirable negative charge in the n-type region 202, such as negative charge created by an SEU strike.

In particular, the n-type region 202 includes an n-well 414 and an associated contact 416 which is coupled to a predetermined reference voltage, shown here as Vcc for example. As will be described in more detail below, the n-well 414 is used to attract majority charge generated by an SEU strike in the n-type region 202. Similarly, p-type regions are provided as taps in the p-wells 204 and 206. In particular, a p-type region 418 and a corresponding contact 420 are provided in the p-well 206, while a p-well 422 and a corresponding contact 424 are provided in the p-well 204. The p-wells 418 and 422 are used to attract majority charge generated by an SEU strike in the p-wells 204 and 206. While one p-well functioning as a trap could be implemented in each p-well 204 and 206, various n-wells functioning as a trap could be positioned in various regions of the n-type region 202, where an n-well may be located near the pmos transistors for a CMOS memory cell.

Examples of SEU strikes are provided in FIGS. 4 and 5 to show the various paths for dissipating excess charge. Because the p-n junctions are reverse biased, undesirable minority charge generated by an SEU strike is attracted to a p-n junction, and minority carriers is drawn away from source or drain regions of transistors in the region to prevent unintentionally changing data stored in the CMOS memory array, as will be described in more detail below. FIGS. 4 and 5 shows an SEU strike on a source contact 404 at different angles to indicate how the p-n junction created by the p-wells 204 and 206 attract minority charge. During an SEU strike, electrons and holes are generated as shown by the solid arrows in FIGS. 4 and 5. Majority charge (i.e. holes in p-wells 204 and 206 and electrons in n-type region 202) generated during an SEU strike is collected by well taps. More particularly, positive charge (designated by the + symbols) in the p-well 206 is attracted to the p-well 418 (coupled to ground or a negative voltage) as shown by the dashed arrow designating "path a" of FIG. 4. Similarly, negative charge in the n-type region 202 is attracted to the positively biased n-well 414 as shown by the dashed arrow designating "path b" of FIG. 4.

Minority charge generated during a strike, which may cause a change in a logical value stored in a memory element, is collected by reverse biased p-n junctions. In the n-type region 202, the reversed bias junctions are the walls of the n-type region 202 and the p-wells 204 and 206 as shown. Accordingly, the minority positive charge in the p-well 206 is attracted to the wall of the n-type region 202 as shown by the dashed arrow representing "path c" in FIG. 4. Similarly, positive charge in the n-type region 202 is attracted to the p-well 206 as shown by the dashed arrow of "path d." As shown in FIG. 5, if the SEU strike XB is directed at a different angle, the minority charge is attracted to the p-n junction of p-well 204, as shown by "path e," while the majority charge is still attracted to the n-type region 414 as shown by "path f." By increasing the amount of p-n junctions in the CMOS memory element, the effects of an SEU impact can be significantly reduced.

Turning now to FIGS. 6A-D, a series of cross-sectional views show the formation of the CMOS memory elements of FIG. 1. The p-epi layer 402 is formed on the p-type wafer 401, as shown in FIG. 6-A. The n-type regions 202 and the p-wells 204 and 206 are then formed as shown in FIG. 6-B. The p-wells or n-wells of the transistors and the taps are then formed in the p-wells 204 and 206 and the n-type region 202, as shown in FIG. 6-C. The contact elements for the source and drain elements are then formed, as shown in FIG. 6-D.

Figure 7:
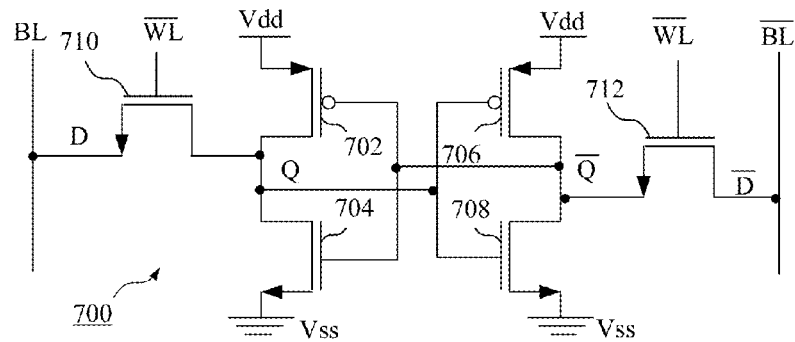
FIG. 7 is a block diagram of a memory element according to an embodiment.

Turning now to FIG. 7, a block diagram of a memory cell is shown. The memory cell includes an inverter having a p-channel transistor 702 with a source coupled to a reference voltage, such as Vdd, and a drain coupled at a first node "Q" to a drain of an n-channel transistor 704, the source of which is coupled to a ground potential (Vss). The memory cell includes a second inverter having a p-channel transistor 706 with a source coupled to the reference voltage and a drain coupled at a second node "Q-bar" to a drain of an n-channel transistor 708, the source of which is also coupled to ground. The first node "Q" is controlled by an n-channel transistor 710 coupled to receive a word line (WL) signal at its gate which controls the receipt of input data on a bit line (BL) at the first node. The second node "Q-bar" is controlled by another n-channel transistor 712 coupled to receive the word line signal at its gate which controls the receipt of inverted input data at the second node. While the memory cell of FIG. 7 is shown by way of example, other memory cells could be employed. Depending upon the dimensions of the transistors of a memory, and particularly the gate widths of the transistors of a memory, a particle associated with cosmic radiation may affect a number of transistors. By providing the increased p-n junctions as set forth above, a loss of data can be significantly reduced.

Figure 8:
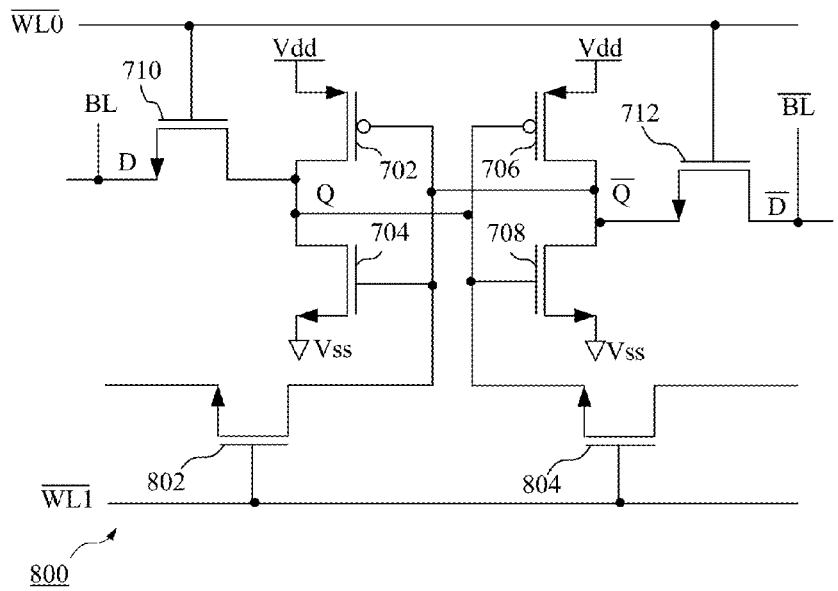
FIG. 8 is a block diagram of a memory element according to an alternate embodiment.

While the embodiment of FIG. 7 represents a "6T cell," the embodiment of FIG. 8 represents an "8T cell." In particular, the transistors 802 and 804 are configured to enable separate word lines WL0 and WL1. The transistors 802 and 804 are configured as shown to have the source coupled to the Q and Qbar nodes as shown, where the gates are each controlled by the WL1.

Figure 9:
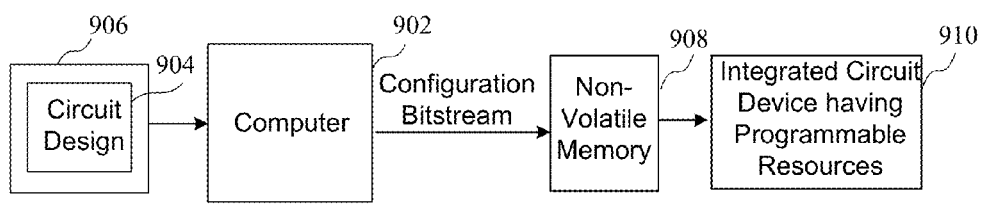
FIG. 9 is a block diagram of a system for programming a device having programmable resources according to an embodiment.

Turning now to FIG. 9, a block diagram of a system for programming a device having programmable resources is shown. In particular, a computer 902 is coupled to receive a circuit design 904 from a memory 906, and generate a configuration bitstream which is stored in the non-volatile memory 906. As will be described in more detail below, the circuit design may be a high level design, such as a circuit design defined in a hardware description language (HDL). Also, the computer may be configured to run software that generates a configuration bitstream which is stored in the non-volatile memory 906.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 902 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 10:
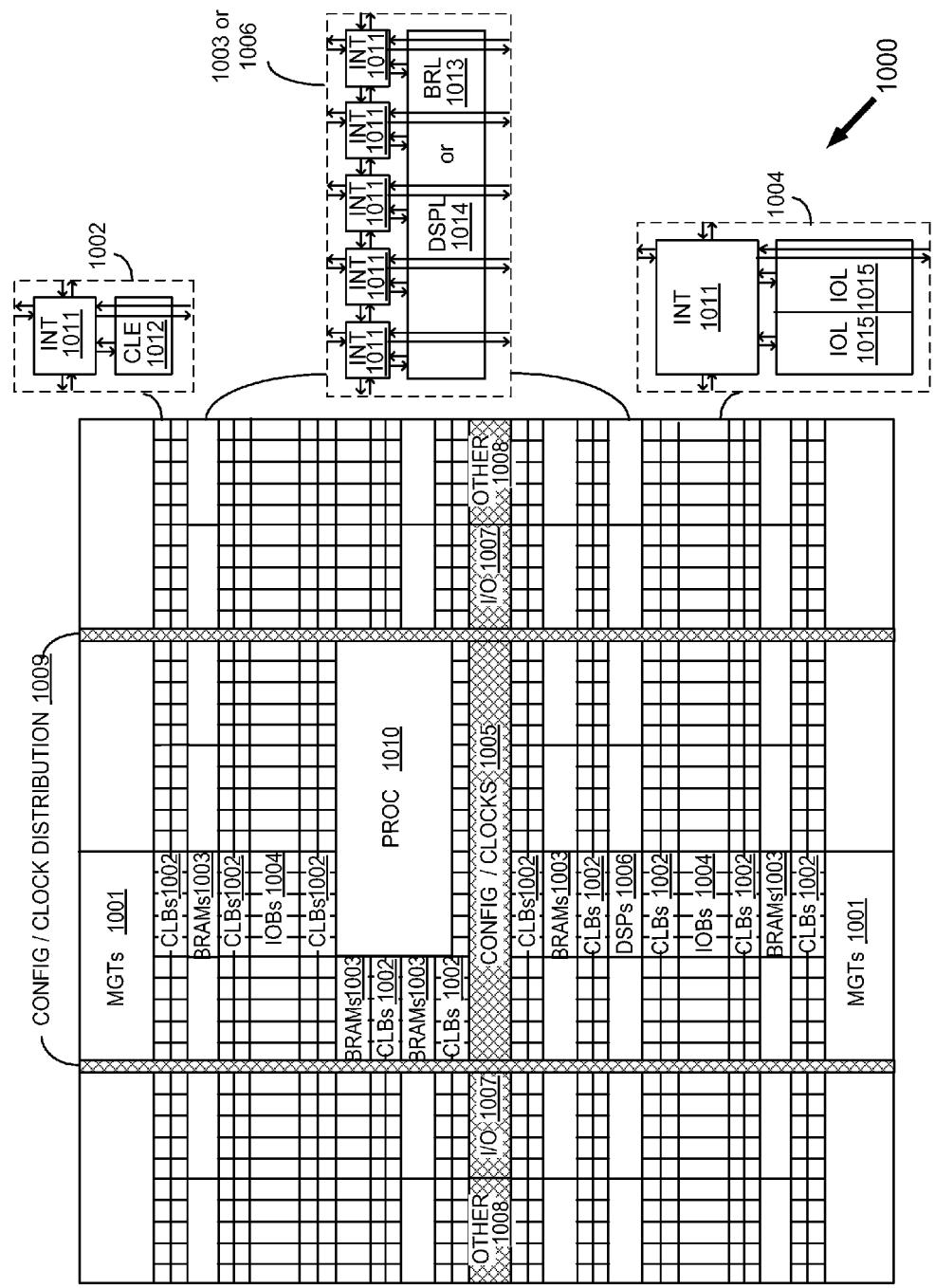
FIG. 10 is a block diagram of a device having programmable resources including memory elements according to FIG. 1.

Turning now to FIG. 10, a block diagram of a programmable integrated circuit device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 10 comprises an FPGA architecture 1000 having a large number of different programmable tiles including multi-gigabit transceivers (MGTs) 1001, CLBs 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007 (e.g., configuration ports and clock ports), and other programmable logic 1008 such as digital clock managers, analog-to-digital converters, system monitoring logic, and so forth. Some FPGAs also include dedicated processor blocks (PROC) 1010, which may be used to implement a software application, for example.

In some FPGAs, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single programmable interconnect element 1011. A BRAM 1003 may include a BRAM logic element (BRL) 1013 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1006 may include a DSP logic element (DSPL) 1014 in addition to an appropriate number of programmable interconnect elements. An IOB 1004 may include, for example, two instances of an input/output logic element (IOL) 1015 in addition to one instance of the programmable interconnect element 1011. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 1009 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear in order to facilitate the efficient implementation of user logic. While the embodiment of FIG. 10 relates to an integrated circuit having programmable resources, it should be understood that the circuits and methods set forth in more detail below could be implemented in any type of ASIC.

Figure 11:
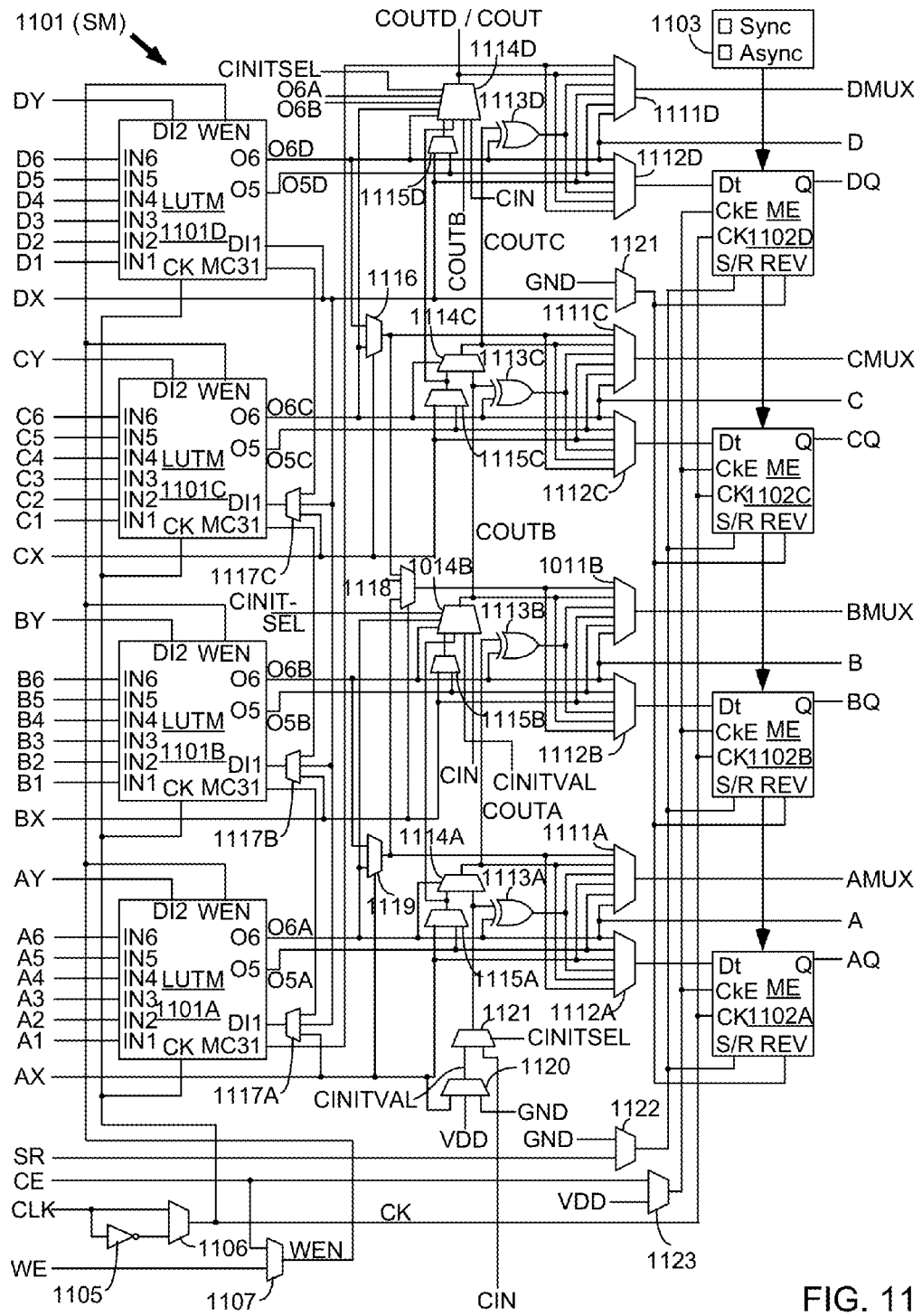
FIG. 11 is block diagram of a configurable logic element of the device of FIG. 10 according to an embodiment.

Turning now to FIG. 11, a block diagram of a configurable logic element according to an embodiment is shown. In particular, FIG. 11 illustrates in simplified form a configurable logic element of a configuration logic block 1002 of FIG. 10. In the embodiment of FIG. 11, slice M 1101 includes four lookup tables (LUTMs) 1101A-1101D, each driven by six LUT data input terminals A1-A6, B1-B6, C1-C6, and D1-D6 and each providing two LUT output signals O5 and O6. The O6 output terminals from LUTs 1101A-1101D drive slice output terminals A-D, respectively. The LUT data input signals are supplied by the FPGA interconnect structure via input multiplexers, which may be implemented by programmable interconnect element 1111, and the LUT output signals are also supplied to the interconnect structure. Slice M also includes: output select multiplexers 1111A-1111D driving output terminals AMUX-DMUX; multiplexers 1112A-1112D driving the data input terminals of memory elements 1102A-1102D; combinational multiplexers 1116, 1118, and 1119; bounce multiplexer circuits 1122-1123; a circuit represented by inverter 1105 and multiplexer 1106 (which together provide an optional inversion on the input clock path); and carry logic having multiplexers 1114A-1114D, 1115A-1115D, 1120-1121 and exclusive OR gates 1113A-1113D. All of these elements are coupled together as shown in FIG. 11. Where select inputs are not shown for the multiplexers illustrated in FIG. 11, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 11 for clarity, as well as from other selected figures herein.

In the pictured embodiment, each memory element 1102A-1102D may be programmed to function as a synchronous or asynchronous flip-flop or latch. The selection between synchronous and asynchronous functionality is made for all four memory elements in a slice by programming Sync/Asynch selection circuit 1103. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1102A-1102D are clocked by a clock signal CK, which may be provided by a global clock network or by the interconnect structure, for example. Such programmable memory elements are well known in the art of FPGA design. Each memory element 1102A-1102D provides a registered output signal AQ-DQ to the interconnect structure. Because each LUT 1101A-1101D provides two output signals, O5 and O6, the LUT may be configured to function as two 5-input LUTs with five shared input signals (IN1-1N5), or as one 6-input LUT having input signals IN1-IN6.

In the embodiment of FIG. 11, each LUTM 1101A-1101D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1117A-1117C for LUTs 1101A-1101C), or to the two 32-bit RAMs via input terminals DI1 and DI2. RAM write operations in the LUT RAMs are controlled by clock signal CK from multiplexer 1006 and by write enable signal WEN from multiplexer 1107, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1101A may also be provided to the general interconnect structure for shift register chaining, via output select multiplexer 1111D and CLE output terminal DMUX. Accordingly, the circuits and methods set forth above may be implemented in a device such as the devices of FIGS. 10 and 11, or any other suitable device.

Figure 12:
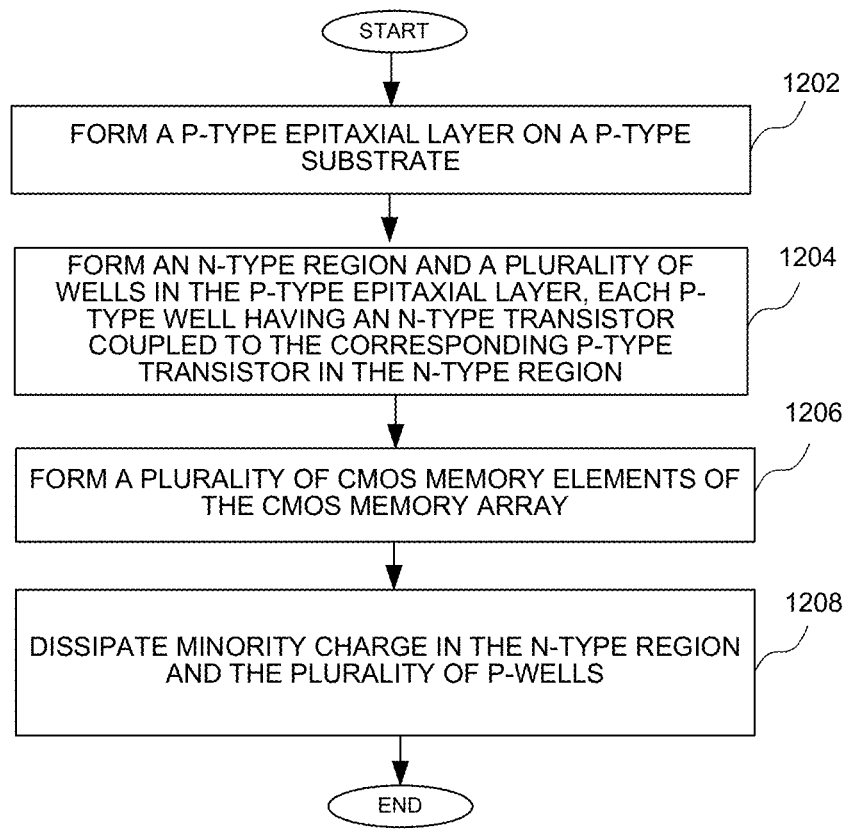
FIG. 12 is a flow chart showing a method of implementing a CMOS memory array according to an embodiment.

Turning now to FIG. 12, a flow chart shows a method of improving radiation immunity in an integrated circuit. In particular, a p-type epitaxial layer is formed on a p-type substrate at a block 1202. An n-type region and a plurality of p-wells are formed in the p-type epitaxial layer, each p-well having an n-type transistor coupled to the corresponding p-type transistor in the n-type region at a block 1204. A plurality of CMOS memory elements of the CMOS memory array are formed at a block 1206. Minority charge in the n-type region and the plurality of p-wells is dissipated at a block 1208. The minority charge may be dissipated at the various p-n junctions and taps as described in reference to FIGS. 4 and 5. The method of FIG. 12 may be implemented using any of the embodiments of FIGS. 1-11 as described, or any other suitable circuits.

It can therefore be appreciated that the new CMOS memory array having improved radiation immunity and method of implementing a CMOS memory array has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A memory array having improved radiation immunity, comprising:
    a plurality of memory elements;
    wherein each memory element has a pair of p-wells and an n-type region;
    wherein, for each memory element, each p-well has an n-type transistor coupled to a corresponding p-type transistor in the n-type region and is surrounded on at least three sides by the n-type region; and
    wherein, for each memory element, each p-well provides a p-n junction to dissipate minority charge in a portion of the n-type region occupied by a corresponding p-type transistor and associated with at least two adjacent memory elements.

2. The memory array of claim 1, wherein, for each memory element, p-type transistors are formed between the pair of p-wells, each p-well of the pair of p-wells forming a p-n junction for dissipating minority charge in a portion of the n-type region between the pair of p-wells.

3. The memory array of claim 1, wherein each p-well provides four p-n junctions to dissipate minority charge in portions of the n-type region surrounding the p-well.

4. The memory array of claim 1, wherein minority charge in the n-type region is attracted to at least two p-wells.

5. The memory array of claim 1, wherein the n-type region is formed in the p-type epitaxial layer.

6. The memory array of claim 5, wherein the p-type epitaxial layer is formed on a p-type substrate.

7. A memory array having improved radiation immunity, comprising:
    a p-type epitaxial layer;
    an n-type region formed in the p-type epitaxial layer; and
    a plurality of p-wells formed in the p-type epitaxial layer, each p-well having an n-type transistor coupled to a corresponding p-type transistor in the n-type region;
    wherein each memory element of the memory array comprises a first p-well and a second p-well of the plurality of p-wells, each of the first p-well and the second p-well being surrounded by the n-type region on at least three sides.

8. The memory array of claim 7, wherein each p-well further comprises a p-type region coupled to ground to attract undesirable majority charge in the p-well.

9. The memory array of claim 8, wherein the n-type region comprises a plurality of n-wells coupled to a reference voltage to attract undesirable majority charge in the n-type region.

10. The memory array of claim 9, wherein each n-well of the plurality of n-wells is associated with a corresponding memory element of the plurality of memory elements.

11. The memory array of claim 7, wherein each p-well of a memory element provides p-n junctions to dissipate minority charge in a region occupied by a corresponding p-type transistor.

12. The memory array of claim 11, wherein each p-well of the memory element provides a p-n junction to dissipate minority charge in regions associated with at least two adjacent memory elements.

13. The memory array of claim 7, wherein minority charge in the n-type region is attracted to at least two p-wells of the plurality of p-wells.

14. A method of implementing a memory array having improved radiation immunity, comprising:
    forming a plurality of p-wells, each p-well having an n-type transistor coupled to a corresponding p-type transistor in an n-type region; and forming a plurality of memory elements of the memory array, each memory element comprising a first p-well and a second p-well;

wherein each p-well is surrounded by the n-type region on at least three sides and provides a p-n junction to dissipate minority charge in the n-type region.

15. The method of claim 14, wherein forming a plurality of p-wells comprises providing, for each p-well, p-n junctions to dissipate minority charge in a region occupied by a p-type transistor of a corresponding memory element.

16. The method of claim 14, wherein forming a plurality of p-wells comprises forming the plurality of p-wells in a p-type epitaxial layer.

17. The method of claim 14, further comprising forming the p-type epitaxial layer on a p-type substrate.

18. The method of claim 17, further comprising forming the n-type region in a p-type epitaxial layer.

19. The method of claim 14, wherein, for each memory element, the first p-well is formed in a p-well which is common to a first adjacent memory element and the second p-well is formed in a p-well which is common to a second adjacent memory element.

* * * * *